(12) United States Patent
Lee et al.

(10) Patent No.: US 8,335,038 B2
(45) Date of Patent: *Dec. 18, 2012

(54) APPARATUS FOR MEASURING AERIAL IMAGE OF EUV MASK

(75) Inventors: Dong-gun Lee, Hwaseong-si (KR); Seong-sue Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/910,605

(22) Filed: Oct. 22, 2010

(65) Prior Publication Data

US 2011/0033025 A1   Feb. 10, 2011

Related U.S. Application Data

(63) Continuation of application No. 12/659,261, filed on Mar. 2, 2010, now Pat. No. 7,821,714.

(30) Foreign Application Priority Data

Jun. 3, 2009   (KR) .................. 10-2009-0049097

(51) Int. Cl.
G01B 11/30 (2006.01)
G02B 27/44 (2006.01)
G03F 7/20 (2006.01)
G21K 1/06 (2006.01)

(52) U.S. Cl. ........ 359/565; 359/576; 359/859; 356/607; 356/639; 378/34; 250/492.2

(58) Field of Classification Search .................. 356/607, 356/608, 639–640; 250/249.2; 359/565, 359/567, 355, 366, 859, 861; 378/34
See application file for complete search history.

(56) References Cited

U.S. PATENT DOCUMENTS

| | | | |
|---|---|---|---|
| 4,815,854 A * | 3/1989 | Tanaka et al. ................. | 356/509 |
| 5,737,135 A | 4/1998 | Chan | |
| 6,072,852 A | 6/2000 | Hudyma | |
| 6,081,578 A * | 6/2000 | Braat ............................. | 378/34 |
| 6,178,221 B1 * | 1/2001 | Levinson et al. ............... | 378/35 |
| 6,225,027 B1 * | 5/2001 | Replogle et al. .............. | 430/311 |
| 6,255,661 B1 | 7/2001 | Braat | |
| 6,396,067 B1 | 5/2002 | Braat | |
| 6,426,506 B1 | 7/2002 | Hudyma | |

(Continued)

FOREIGN PATENT DOCUMENTS

KR   10-2007-0042778 A   4/2007
KR   10-0850214 B1   7/2008

*Primary Examiner* — Sang Nguyen
(74) *Attorney, Agent, or Firm* — Lee & Morse, P.C.

(57) ABSTRACT

An apparatus for measuring an image of a pattern to be formed on a semiconductor by scanning the pattern using a scanner, the apparatus including an EUV mask including the pattern, a zoneplate lens on a first side of the EUV mask and adapted to focus EUV light on a portion of the EUV mask at a same angle as an angle at which the scanner will be disposed with respect to a normal line of the EUV mask, and a detector arranged on another side of the EUV mask and adapted to sense energy of the EUV light from the EUV mask, wherein $NA_{zoneplate}=NA_{scanner}/n$ and $NA_{detector}=NA_{scanner}/n*\sigma$, where $NA_{zoneplate}$ denotes a NA of the zoneplate lens, $NA_{detector}$ denotes a NA of the detector, and $NA_{scanner}$ denotes a NA of the scanner, $\sigma$ denotes an off-axis degree of the scanner, and n denotes a reduction magnification of the scanner.

26 Claims, 13 Drawing Sheets

U.S. PATENT DOCUMENTS

| | | | |
|---|---|---|---|
| 6,498,685 B1 * | 12/2002 | Johnson | 359/626 |
| 6,738,135 B1 | 5/2004 | Underwood et al. | |
| 6,833,904 B1 * | 12/2004 | Komatsuda | 355/67 |
| 6,835,671 B2 * | 12/2004 | Hector et al. | 430/5 |
| 6,841,322 B1 * | 1/2005 | Lee | 430/30 |
| 6,864,490 B1 * | 3/2005 | Underwood et al. | 250/461.1 |
| 6,879,406 B1 | 4/2005 | Rangarajan et al. | |
| 6,914,723 B2 * | 7/2005 | Yun et al. | 359/565 |
| 6,950,176 B1 * | 9/2005 | LaFontaine et al. | 355/75 |
| 6,963,395 B2 * | 11/2005 | Goldberg | 356/237.5 |
| 7,268,945 B2 | 9/2007 | Yun et al. | |
| 7,368,741 B2 * | 5/2008 | Melnychuk et al. | 250/504 R |
| 7,414,708 B2 | 8/2008 | Bivolaru et al. | |
| 7,623,620 B2 | 11/2009 | Mann et al. | |
| 2004/0062999 A1 | 4/2004 | Stearns et al. | |
| 2008/0297891 A1 | 12/2008 | Kim et al. | |

* cited by examiner $$NA_{zoneplate} = \frac{NA_{scanner}}{n}$$

$$NA_{detector} = \frac{NA_{scanner}}{n} * \sigma$$

$$NA_{scanner} = \sin y$$

$$\sigma = \frac{\sin x}{\sin y}$$

APPARATUS FOR MEASURING AERIAL IMAGE OF EUV MASK

CROSS REFERENCE TO RELATED APPLICATION

This is a continuation application based on application Ser. No. 12/659,261, filed Mar. 2, 2010, now U.S. Pat. No. 7,821,714, the entire contents of which is hereby incorporated by reference.

BACKGROUND

1. Field

Embodiments relate to a method of manufacturing a semiconductor device. More particularly, embodiments relate to an apparatus and a method of measuring a defect of a mask used to form a fine pattern during a scanning process employable during manufacturing a semiconductor device.

2. Description of the Related Art

Recently, as illumination light sources having shorter wavelengths are needed to further miniaturize the line width of a semiconductor circuit, research into a scanning process using an extreme ultra-violet (EUV) having a wavelength of 50 nm or less as a scanning light source has been actively performed.

Since the complexity of a scanning process has gradually increased, even a small defect in a mask may cause a serious defect in a circuit pattern on a wafer. Thus, when a pattern is formed on a wafer by using a photomask, in order to identify in advance the influence of various defects formed in the photomask on the wafer, defects of the photomask are detected by measuring the aerial image of the photomask.

A conventional apparatus for measuring an aerial image of a EUV mask includes a plurality of EUV mirrors. Thus, the manufacture and installation of the mirrors require use of various technologies. In addition, many mirrors are used because the reflection rate of one mirror is not 100%. Thus, a high power source is required. Accordingly, such conventional apparatus for measuring an aerial image of a EUV mask is expensive, and additionally, a long development period is necessary for making the apparatus.

SUMMARY

Embodiments are therefore directed to an apparatus for and a method of measuring a defect in a mask, which substantially overcome one or more of the problems due to the limitations and disadvantages of the related art.

It is therefore a feature of an embodiment to provide an apparatus for and a method of measuring a defect in a mask employable for forming a fine pattern during a scanning process employable during manufacturing a semiconductor device.

It is therefore another feature of an embodiment to provide an apparatus for measuring an aerial image of an extreme ultra-violet (EUV) mask, wherein the apparatus is capable of perfectly emulating a numerical aperture (NA) and off-axis degree ($\sigma$) of a scanner although the overall complexity and required technological level thereof may be simplified and/or reduced as compared to comparable conventional devices.

It is therefore a separate feature of an embodiment to provide an apparatus for measuring an aerial image of a EUV mask, wherein the apparatus may have a shorter development period and/or lower development cost than a comparable conventional apparatus for measuring an aerial image of a EUV mask.

At least one of the above and other features and advantages may be realized by providing an apparatus for measuring an aerial image, the apparatus including a movable unit adapted to move a reflective extreme ultra-violet (EUV) mask disposed thereon in an x-axis and/or y-axis direction, an X-ray mirror arranged on the movable unit, the X-ray mirror being adapted to selectively reflect a coherent EUV light having a selected wavelength, a zoneplate lens that is located between the movable unit and the X-ray mirror, the zoneplate lens being adapted to focus the coherent EUV light on a portion of the reflective EUV mask, and a detector arranged on the movable unit, the detector being adapted to sense energy of the reflected coherent EUV light when the focused coherent EUV light is reflected by the portion of the reflective EUV mask, wherein $NA_{zoneplate}=NA_{scanner}/4$ and $NA_{detector}=NA_{scanner}/4*\sigma$, where $NA_{zoneplate}$ denotes a numerical aperture (NA) of the zoneplate lens, $NA_{detector}$ denotes a NA of the detector, and $NA_{scanner}$ denotes a NA of a scanner, and $\sigma$ denotes an off-axis degree of the scanner.

An aperture may be between the reflective EUV mask and the detector.

The X-ray mirror may include a multi-layer structure including at least one molybdenum layer and at least one silicon layer, which are alternately arranged.

The EUV light generator may include a high power femtosecond laser adapted to output a high power femtosecond laser beam, a gas cell adapted to generate the coherent EUV light having a selected wavelength from the high power femtosecond laser, and a lens adapted to focus the high power femtosecond laser beam on the gas cell.

The gas cell may be filled with a neon gas so as to optimize a production efficiency of a coherent EUV light having a wavelength of 13.5 nm.

The X-ray mirror may be adapted to reflect the coherent EUV light emitted from the EUV light generator toward the portion of the reflective EUV mask at an angle of about 4° to about 8° with respect to a normal line of the reflective EUV mask.

The zoneplate lens may be adapted to focus the reflected coherent EUV light on the portion of the reflective EUV mask at an angle of about 4° to about 8° with respect to a normal line of the reflective EUV mask.

The apparatus may include a computing unit adapted to reconstruct an image of the reflective EUV mask based on energy sensed by the detector.

At least one of the above and other features and advantages may be separately realized by providing an apparatus for measuring an aerial image of a pattern corresponding to a semiconductor pattern to be formed by scanning the pattern using a scanner, the apparatus including an extreme ultra-violet (EUV) mask including the pattern, a zoneplate lens arranged on a first side of the EUV mask and adapted to focus EUV light on a portion of the EUV mask at a same angle as an angle at which the scanner will be disposed with respect to a normal line of the EUV mask, and a detector arranged on a second side of the EUV mask and adapted to sense energy of the EUV light from the EUV mask, wherein $NA_{zoneplate}=NA_{scanner}/n$ and $NA_{detector}=NA_{scanner}/n*\sigma$, where $NA_{zoneplate}$ denotes a NA of the zoneplate lens, $NA_{detector}$ denotes a NA of the detector, and $NA_{scanner}$ denotes a NA of the scanner, $\sigma$ denotes an off-axis degree of the scanner, and n denotes a reduction magnification of the scanner.

The apparatus may include a movable unit on which the EUV mask is arranged, the movable unit being adapted to move the EUV mask in an x-axis direction and/or an y-axis direction.

The EUV mask may be a reflective EUV mask including a reflective material.

The detector may be adapted to sense energy of reflected EUV light that is reflected from the reflective EUV mask.

The apparatus may include an EUV light generator and an X-ray mirror adapted to selectively reflect the EUV light from the EUV light generator.

The EUV light generator may include a high power femtosecond laser.

The EUV mask may be a transmissive EUV mask.

The detector may be adapted to sense energy of transmitted coherent EUV light that is transmitted through the transmissive EUV mask.

At least one of the above and other features and advantages may be separately realized by providing a method of measuring an aerial image of a pattern corresponding to a semiconductor pattern to be formed by scanning the pattern using a scanner, the method including generating extreme ultra-violet (EUV) light, reflecting the generated EUV light using an X-ray mirror, transmitting the reflected EUV light from the X-ray mirror using a zoneplate lens toward the pattern on an EUV mask, sensing energy of the EUV light from the EUV mask using a detector, converting the sensed energy into image information and storing the image information, moving the EUV mask in an x-axis direction and/or a y-axis direction, and outputting the aerial image of the pattern of the EUV mask based on the stored image information, wherein $NA_{zoneplate}=NA_{scanner}/4$ and $NA_{detector}=NA_{scanner}/4*\sigma$, where $NA_{zoneplate}$ denotes a numerical aperture (NA) of the zoneplate lens, $NA_{detector}$ denotes a NA of the detector, and $NA_{scanner}$ denotes a NA of a scanner, and $\sigma$ denotes an off-axis degree of the scanner.

Generating extreme ultra-violet (EUV) light may include generating a high power femtosecond laser beam.

Reflecting the generated EUV light using an X-ray mirror may include reflecting the EUV light emitted from an EUV light generator toward a portion of the EUV mask at an angle of about 4° to about 8° with respect to a normal line of the EUV mask.

Transmitting the reflected EUV light from the X-ray mirror using a zoneplate lens may include transmitting the EUV light reflected from the X-ray mirror toward a portion of the EUV mask at an angle of about 4° to about 8° with respect to a normal line of the EUV mask.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0049097, filed on Jun. 3, 2009, in the Korean Intellectual Property Office, and entitled: "Apparatus and Method for Measuring Aerial Image of EUV Mask," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
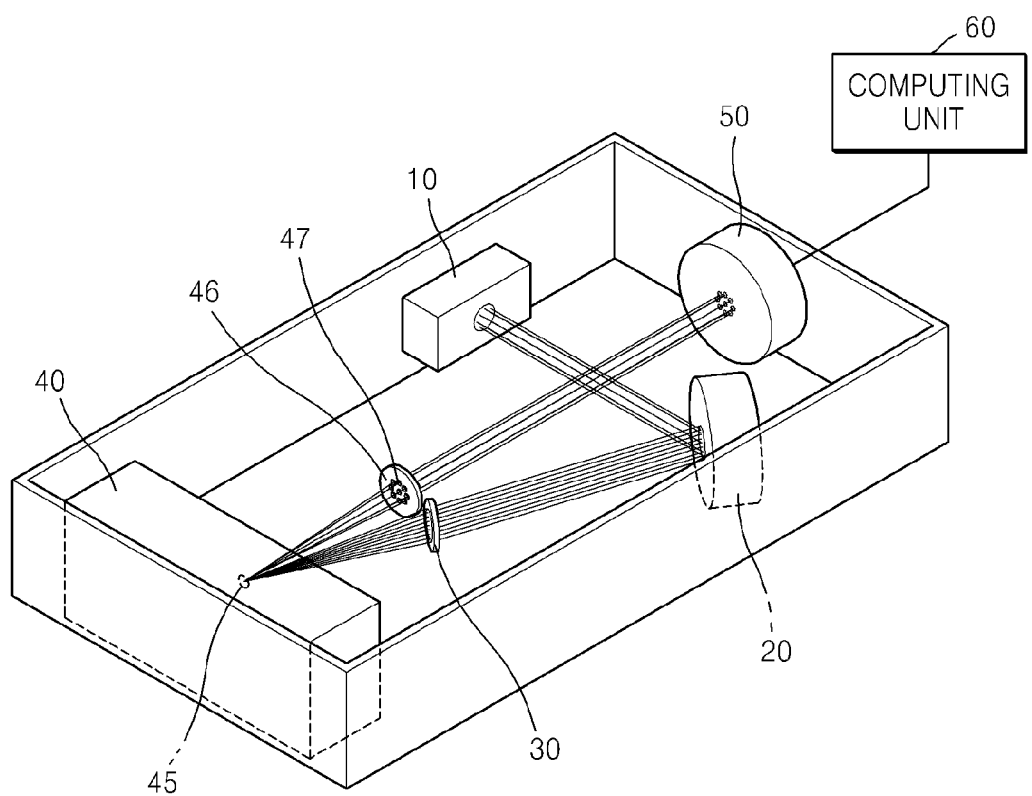
FIGS. 1 and 2 illustrate schematic diagrams of an exemplary embodiment of an apparatus employable for measuring an aerial image.
Figure 2:
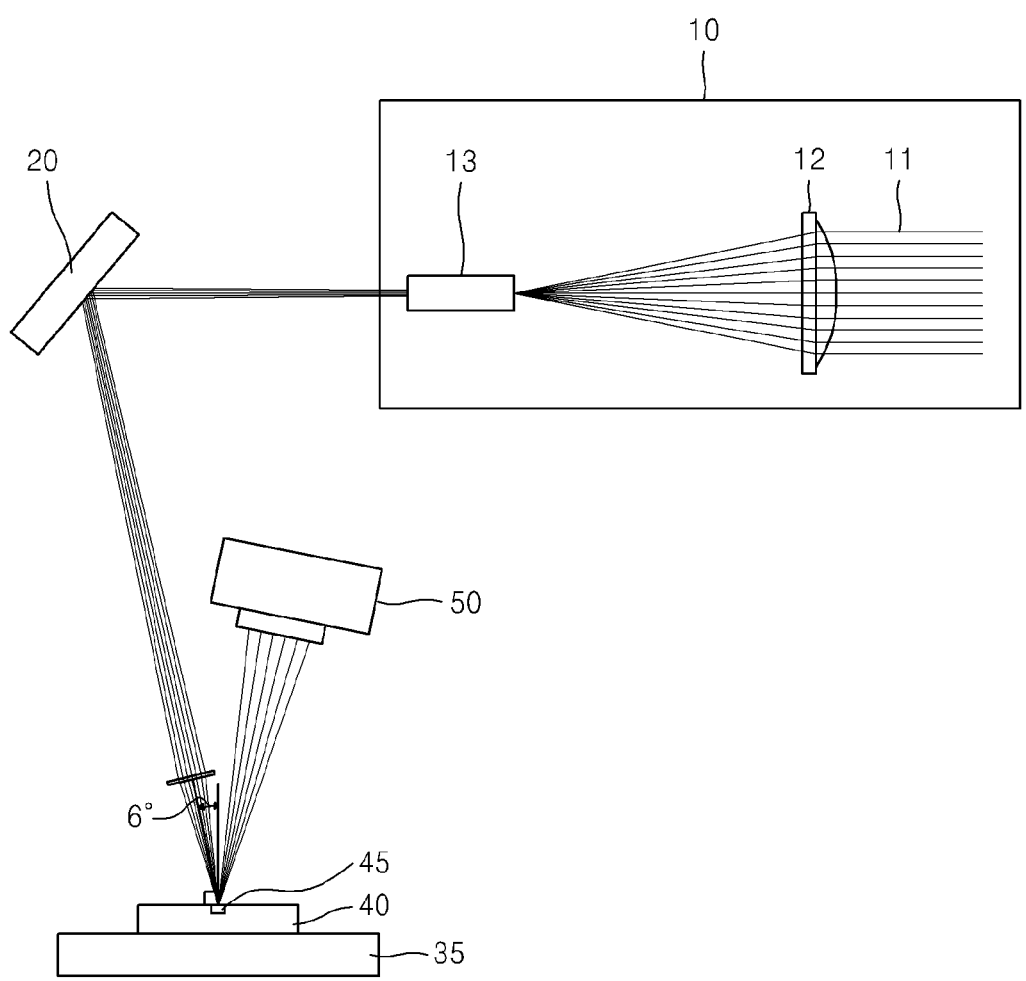

FIGS. 1 and 2 illustrate schematic diagrams of an exemplary embodiment of an apparatus employable for measuring an aerial image.

Referring to FIG. 1, the apparatus for measuring an aerial image may include a reflective extreme ultra-violet (EUV) light generation unit 10, an X-ray mirror 20, a zoneplate lens 30, a reflective EUV mask 40 (hereinafter referred to as a "mask"), a detector 50, and a computing unit 60. The EUV light generation unit 10 may generate EUV light having a wavelength about 12 nm to about 14 nm. The EUV light may be coherent EUV light.

The EUV light may be reflected by the X-ray mirror 20 and may move toward the zoneplate lens 30. The X-ray mirror 20 may selectively reflect the EUV light having a wavelength of about 12 nm to about 14 nm. The reflected EUV light may be focused on a portion 45 of the mask 40 through the zoneplate lens 30. The EUV light focused on the portion 45 may be reflected to the detector 50 by the mask 40. The detector 50 may sense energy of the EUV light and may transfer energy information to the computing unit 60.

The X-ray mirror 20 may include palladium (Pd)/carbon (C) and molybdenum (Mo)/silicon (Si). In some embodiments, the X-ray mirror 20 may include, e.g., a Mo/Si multilayer structure including 80 Mo and Si layers, wherein the Mo layers and Si layers may be alternately formed. The Mo layers and the Si layers may be thin films formed by sputtering. The X-ray mirror 20 may selectively reflect EUV light having a wavelength of about 13.5 nm.

The mask 40 may include a reflective material. The mask 40 may include an upper portion with a fine circuit pattern having a size of about 45 nm or less.

The apparatus for measuring an aerial image may further include an aperture 46 for transmitting the EUV light reflected by the mask 40. The aperture 46 may include pinholes 47. A numerical aperture of the zoneplate lens 30 may be controlled by changing a hole size of the pinholes 47.

Referring to FIG. 2, the EUV light generation unit 10 may include a light source 11, a lens 12, and a gas cell 13. The light source 11 may generate a high power femtosecond laser beam. The high power femtosecond laser may be a Ti:Sapphire laser outputting a wavelength of about 800 nm and may be focused on the gas cell 13 through the lens 12. The gas cell 13 may be evacuated and may include fine pores for allowing a laser to pass therethrough. The gas cell 13 may be filled with neon gas to improve and/or optimize generation efficiency of the EUV light with a wavelength of 13.5 nm.

The X-ray mirror 20 may be arranged such that the generated EUV light may be incident on the portion 45 of the mask 40 at a same angle as an incident angle at which a scanner is disposed with respect to a normal line of the mask 40. The zoneplate lens 30 (see FIG. 1) may perform a same function as the X-ray mirror 20. That is, the zoneplate lens 30 may be arranged such that the EUV light reflected by the X-ray mirror 20 may be incident on the portion 45 of the mask 40 at the same angle as the incident angle at which a scanner may be disposed with respect to a normal line of the mask 40.

In some embodiments, the incident angle of the scanner may be in a range of about 4° to about 8°, e.g., 6°. In such embodiments, the X-ray mirror 20 may be arranged such that the generated EUV light may be incident on the portion 45 of the mask 40 at an angle of, e.g., 6°, with respect to a normal line of the mask 40. Instead of the X-ray mirror 20, the zoneplate lens 30 may be arranged such that the EUV light reflected by the X-ray mirror 20 may be incident on the portion 45 of the mask 40 at an angle of 6° with respect to the normal line of the mask 40.

In some embodiments, the apparatus for measuring an aerial image may include a movable unit 35 arranged adjacent, e.g., under, the mask 40. The movable unit 35 may move the mask 40 along an x-axis and/or y-axis direction, and may allow the detector 50 to scan an entire upper surface of the mask 40.

Figure 3A:
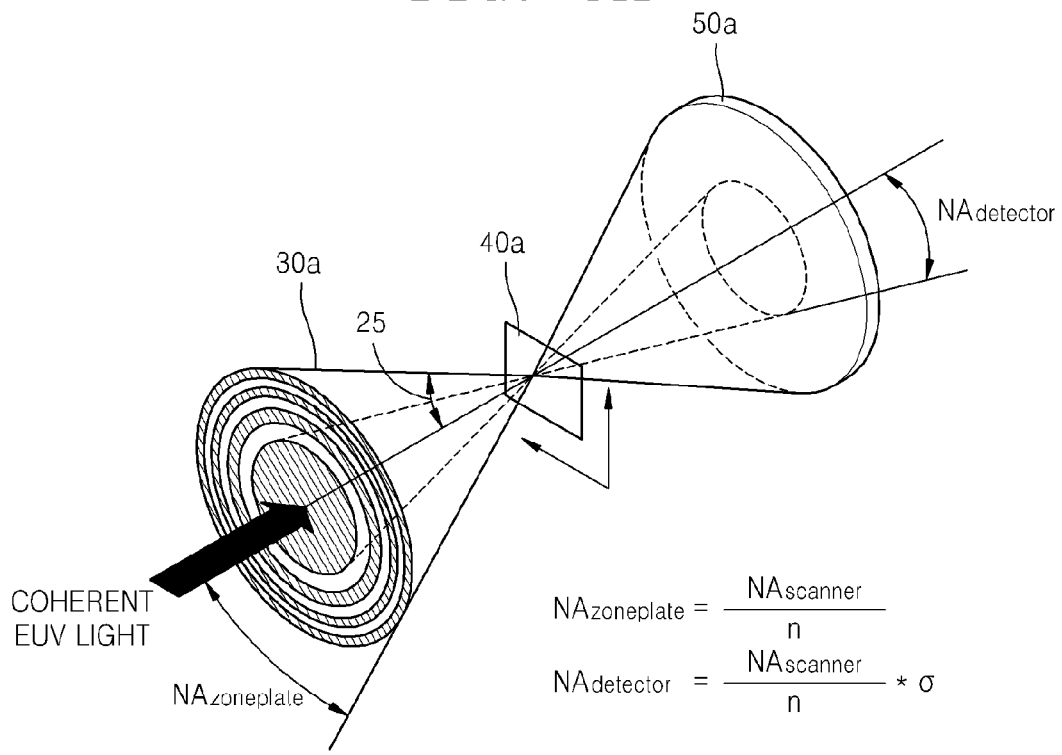
FIG. 3A illustrates a schematic diagram of an exemplary embodiment of a zoneplate lens and a detector employable in an apparatus for measuring an aerial image.
Figure 3B:
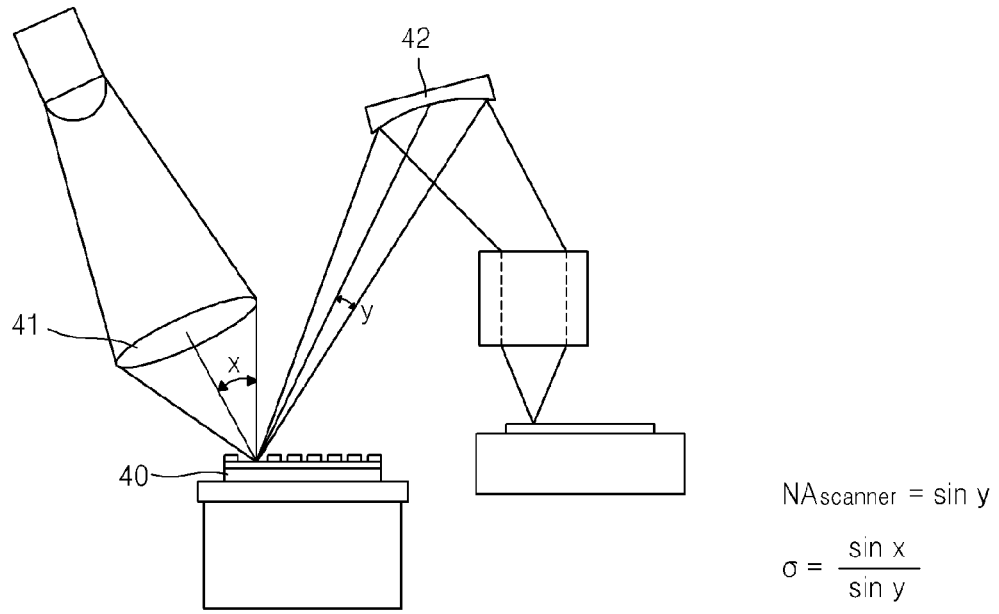
FIG. 3B illustrates a schematic diagram of an exemplary embodiment of a scanner employable in an apparatus for measuring an aerial image.

FIG. 3A illustrates a schematic diagram of an exemplary embodiment of a zoneplate lens 30a and a detector 50a employable in an apparatus for measuring an aerial image, and FIG. 3B illustrates a schematic diagram of an exemplary embodiment of a scanner employable in an apparatus for measuring an aerial image.

In the exemplary embodiment of an apparatus for measuring an aerial image illustrated in FIGS. 1 and 2, the mask (see 40 of FIGS. 1 and 2) reflects the EUV light toward the detector (see 50 of FIGS. 1 and 2). It should be understood that embodiments are not limited thereto. For example, as shown in FIG. 3A, a mask 40a may transmit EUV light toward the detector 50a.

In a EUV scanning process, EUV light may be reflected and/or transmitted by a mask and the reflected/transmitted EUV light may be projected with reduction magnification on a photoresist on a surface of a wafer. For example, a size ratio of a pattern formed on a mask, e.g., 40, 40a, of a scanner to an entity pattern formed by projecting EUV light on the surface of the wafer by the scanner may be in range of about 4:1 to about 5:1. The size ratio of the pattern formed by projecting EUV light by the scanner, i.e., a reduction ratio may be used to control a numerical aperture of the zoneplate lens, e.g., 30, 30a, and the detector, e.g., 50, 50a. In embodiments, to emulate the pattern formed by projecting EUV light by the scanner, the numerical aperture of the detector, e.g., 50, 50a, may be controlled in consideration of an off-axis degree of the scanner.

Referring to FIG. 3A, a relationship between the zoneplate lens 30a, the detector 50a, and the scanner may be represented by Equation 1.

$$NA_{zoneplate} = \frac{NA_{scanner}}{n}$$
$$NA_{detector} = \frac{NA_{scanner}}{n} * \sigma$$
[Equation 1]

In Equation 1, $NA_{zoneplate}$ denotes the numerical aperture (NA) of the zoneplate lens 30a, $NA_{detector}$ denotes the NA of the detector 50a, and $NA_{scanner}$ denotes the NA of the scanner, σ denotes the off-axis degree of the scanner, and n denotes a reduction magnification of the scanner.

Referring to FIG. 3B, a relationship between the $NA_{scanner}$ and σ may be represented by Equation 2.

$$NA_{scanner} = \sin y$$
$$\sigma = \frac{\sin x}{\sin y}$$
Equation 2

In Equation 2, x denotes an angle formed by EUV light focused by a focusing lens 41 of the scanner with respect to a center of the focusing lens 41 and y denotes an angle formed by EUV light that is reflected toward a focusing mirror 42 by the mask 40 with respect to a center of the focusing mirror 42.

More particularly, e.g., in an exemplary embodiment of the mask 40a, the zoneplate lens 30a and the detector 50a of FIG. 3A, a size ratio of a pattern formed in the mask 40a to the entity pattern formed by focusing and projecting EUV light on a surface of the wafer by the scanner may be 4:1. In such an embodiment, because the reduction magnification of the scanner is 4, $NA_{scanner}$ and σ may be calculated using Equation 2, and the zoneplate lens 30a and the detector 50a may designed such that Equation 1 in which $NA_{zoneplate} = NA_{scanner}/4$ and $NA_{detector} = NA_{scanner}/4*\sigma$ is satisfied.

Thus, referring, e.g., to FIG. 3A, embodiments of an apparatus for measuring an aerial image may be formed in consideration of a coherent EUV light, an incident angle 25 of the coherent EUV light that is set to be incident to a portion of the mask 40a at a same angle as an incident angle of a scanner with respect to a normal line of the mask 40a, and numerical apertures of the zoneplate lens 30a and the detector 50a ($NA_{zoneplate}$ and $NA_{detector}$) which may be set to satisfy Equation 1. Embodiments of the apparatus for measuring an aerial image formed as described above may substantially and/or perfectly emulate the numerical aperture and off-axis degree of a scanner. Thus, when the mask 40a is a reflective EUV mask including an upper portion having a circuit pattern, an aerial image that is identical to a circuit pattern projected, by the scanner, on a photoresist of a wafer may be measured using embodiments of an apparatus for measuring an aerial image including one or more features described herein.

Figure 4A:
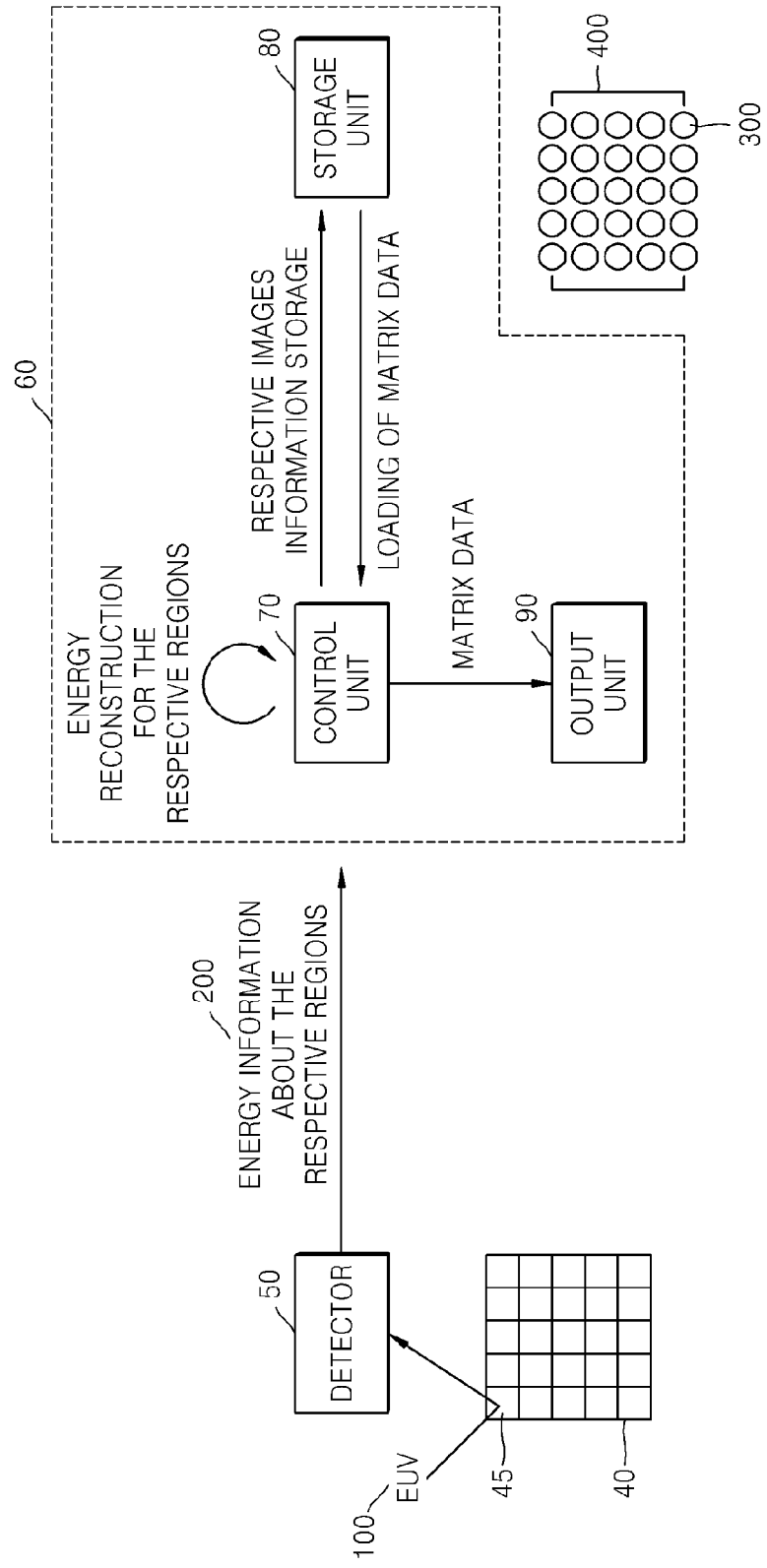
FIG. 4A illustrates a schematic diagram of an exemplary embodiment of a computing unit employable in an apparatus for measuring an aerial image.
Figure 4B:
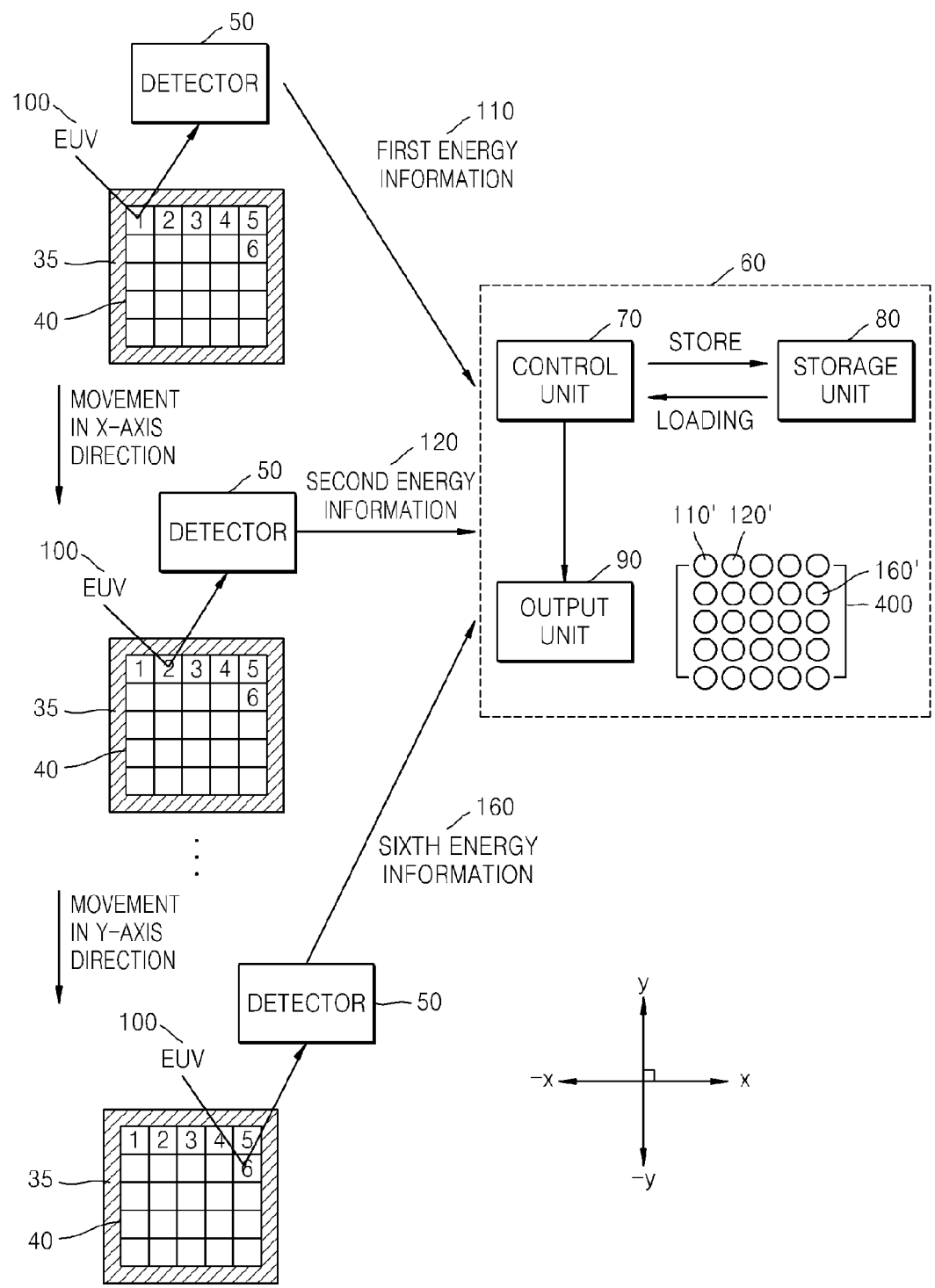
FIG. 4B illustrates a schematic diagram of an exemplary embodiment of a driving process of a detector and a computing unit employable in an apparatus for measuring an aerial image.

FIG. 4A illustrates a schematic diagram of an exemplary embodiment of the computing unit 60 employable in the apparatus of FIG. 1, and FIG. 4B illustrates a schematic diagram of an exemplary embodiment of a driving process of the detector 50 and the computing unit 60 employable in the apparatus of FIG. 1.

Referring to FIG. 4A, the computing unit 60 may include a control unit 70, a storage unit 80, and an output unit 90. When EUV light 100 is reflected by the portion 45 of the mask 40 and energy of the reflected EUV light 100 is detected by the detector 50, an energy information 200 may be transferred to the control unit 70. The control unit 70 may reconstruct an image using the transferred energy information 200. The reconstructed image information 300 may be represented on a scale of 0 to 1 corresponding to the light intensity of the EUV light 100. The reconstructed image information 300 may be transferred to the storage unit 80. The storage unit 80 may store the reconstructed image information 300 about the portion 45 of the mask 40 in the form of a matrix data 400. For example, if the mask 40 is divided in regions (5×5), reconstructed image information about the respective regions may be stored using a matrix data (5×5). The control unit 70 may load the matrix data 400 stored in the storage unit 80. The control unit 70 may transmit the matrix data 400 to the output unit 90. The output unit 90 may output the aerial image of the mask 40 using the transmitted matrix data 400.

More particularly, referring to FIG. 4B, the mask 40 may be divided, e.g., into 25 regions. Further, e.g., EUV light may be reflected in a first region 1, and the detector 50 may sense an energy of the reflected EUV light and transmit first energy information 110 to the computing unit 60. Using the transmitted first energy information 110, the control unit 70 of the computing unit 60 may reconstructs the image of the first region 1 of the mask 40. Reconstructed first image information 110' of the first region may be transmitted to the storage unit 80. The storage unit 80 may store the reconstructed first image information 110' in a region (1×1) of the matrix data 400 (5×5). Then, the movable unit 35 may move the mask 40 in a -x-axis direction.

EUV light may then be reflected in a second region 2 of the mask 40, and the detector 50 may sense an energy of the reflected EUV light and may transmit second energy information 120 to the computing unit 60. Using the transmitted second energy information 120, the control unit 70 of the computing unit 60 may reconstruct the image of the second region 2 of the mask 40. Reconstructed second image information 120' of the second region may be transferred to the storage unit 80. The storage unit 80 may store the reconstructed second image information 120' in a region (1×2) of the matrix data 400. Then, the movable unit 35 may move the mask 40 in the -x-axis direction.

In the exemplary embodiment illustrated in FIG. 4B, such operation may be repeated until an image of a fifth region of the mask 40 is reconstructed and the reconstructed fifth image is stored in the matrix data 400 of the storage unit 80. Then, the movable unit 35 may move the mask 40 in a +y-axis direction. EUV light may then be reflected in a sixth region 6 of the mask 40, and sixth energy information 160 may be generated by the detector 50. The sixth energy information 160 may be transmitted to the computing unit 60. The transmitted sixth energy information 160 may be reconstructed in the control unit 70, and reconstructed sixth image information 160' of the sixth region may be transmitted to the storage unit 80 and stored in a region (2×5) of the matrix data 400.

The images of the 25 regions of the mask 40 may be reconstructed by moving the mask 40 in the x-axis or y-axis, and respectively storing the reconstructed images in the matrix data 400 of the storage unit 80. When the reconstructed image information about the entire region of the mask 40 is stored in the storage unit 80, the control unit 70 may load the matrix data 400 of the storage unit 80. The output unit 90 may then output the aerial image of the mask 40 using the matrix data 400 loaded from the control unit 70.

Figure 5:
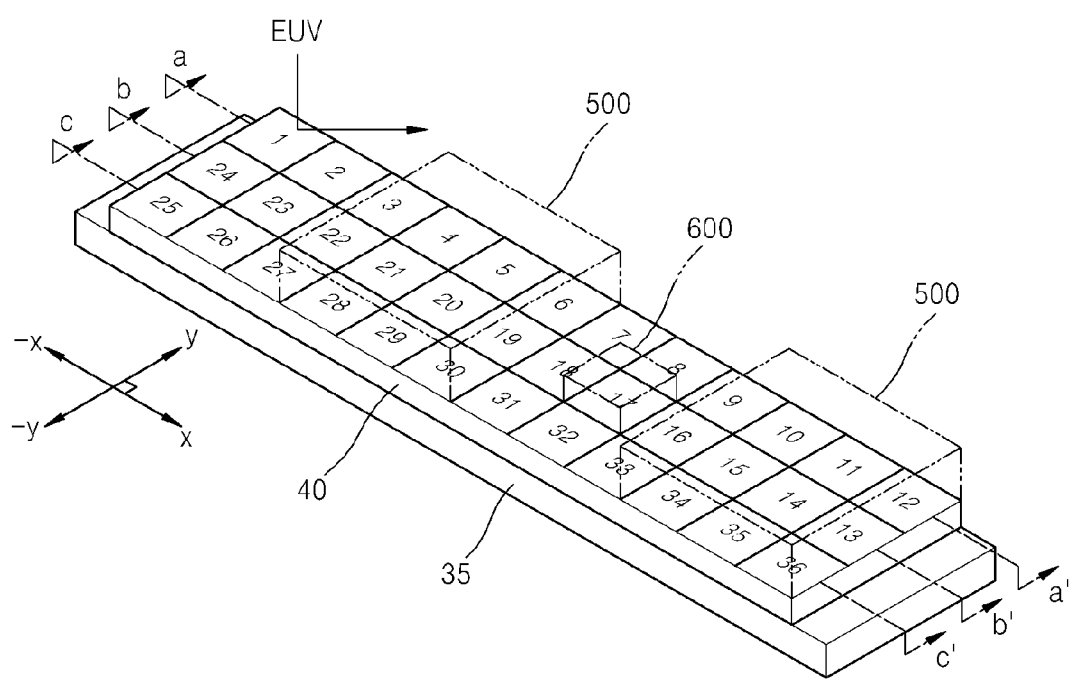
FIG. 5 illustrates a perspective view of an exemplary embodiment of a mask including a mask pattern and a defect thereon.
Figure 6:
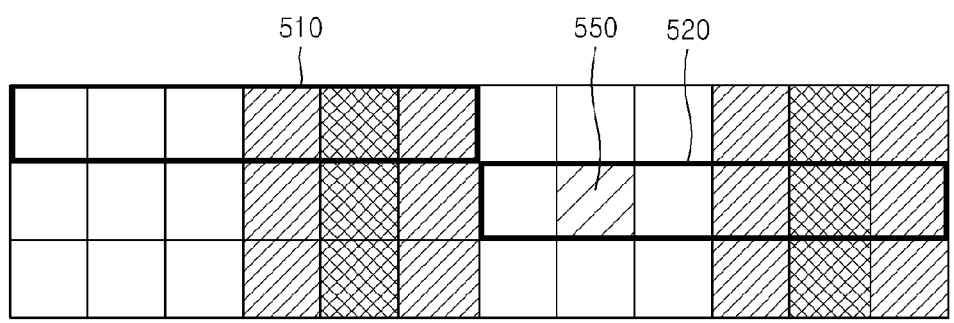
FIG. 6 illustrates an exemplary output image corresponding an aerial image of the mask of FIG. 5, which may be output by the output unit of FIG. 4B in the form of light and darkness.
Figure 7:
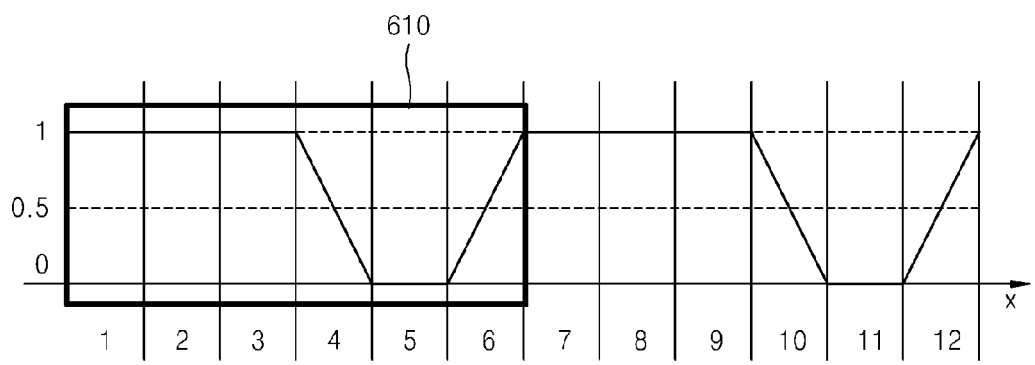
FIG. 7 illustrates exemplary cross-sectional aerial images of diagrams that may be output by the output unit of FIG. 4B, wherein the cross-sections are taken along lines a-a', b-b', and c-c' of FIG. 5.
Figure 7:
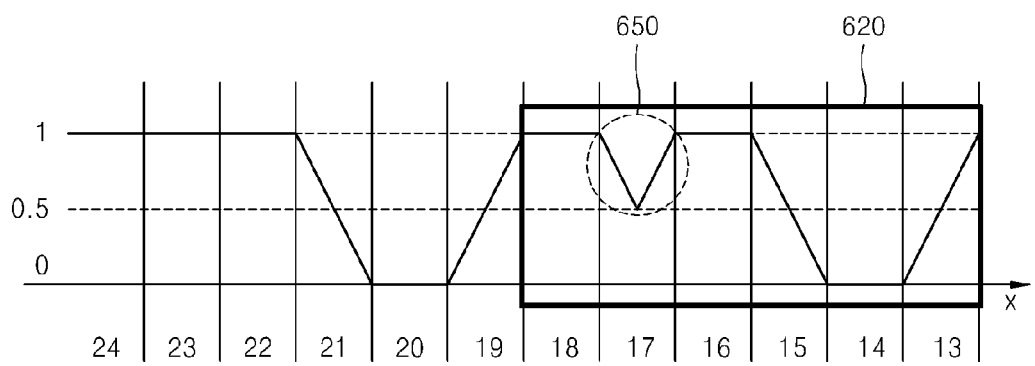
Figure 7:
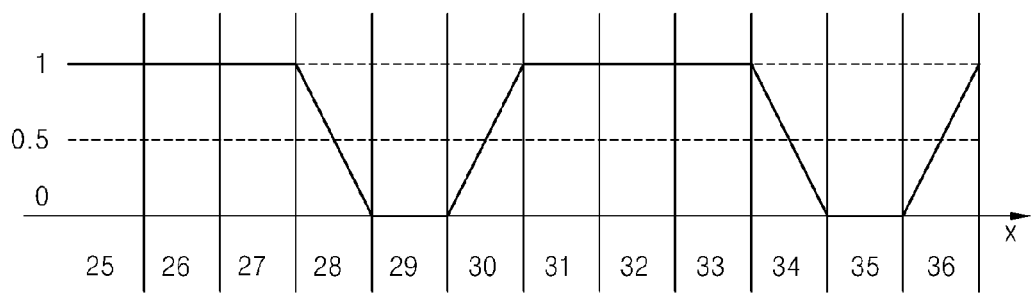

FIG. 5 illustrates a perspective view of an exemplary embodiment of the EUV mask 40 including a mask pattern 500 and a defect 600 thereon. FIG. 6 illustrates an exemplary output image corresponding an aerial image of the mask 40 of FIG. 5, which may be output by the output unit 90 (see FIG. 4B) in the form of light and darkness using the values of the transmitted matrix data (see 400a of FIG. 5). FIG. 7 illustrates exemplary cross-sectional aerial images of diagrams that may be output by the output unit 90 (see FIG. 4B), wherein the cross-sections are taken along lines a-a', b-b', and c-c' of FIG. 5. Referring to FIGS. 5, 6 and 7, operations of the control unit for reconstructing an image and the output unit 90 for outputting an aerial image of the mask 40 are described below. Based on the reconstructed image, it may be determined whether a defect, e.g., 600, exists in a mask pattern 500.

Referring to FIG. 5, the exemplary embodiment of the mask 40 may be divided into 36 regions and the images of the 36 regions of the mask 40 may be reconstructed by moving the mask 40 in the x-axis and y-axis directions. The reconstructed respective image information may be stored in the matrix data 400a (3×12) of the storage unit 80 (See FIG. 4B).

In the exemplary embodiment of FIG. 5, with regard to a first region 1 of the mask 40, energy of most and/or all incident EUV light may be reflected from the first region 1 and may be sensed by the detector, e.g., 50 of FIG. 4B. Thus, in a corresponding region (1×1) of the matrix data 400a, corresponding image information reconstructed by the control unit 70 (FIG. 4B) based on a first energy information generated by the detector 50 with regard to the first region 1 may have a value of '1'. More particularly, the control unit 70 may transmit the value '1' to the storage unit 80 and the value '1' may be stored in the corresponding region (1×1) of the matrix data 400a.

The movable unit 35 may then move the mask 40 in the −x-axis direction. EUV light may then be irradiated to a second region 2 of the mask 40. Referring to FIGS. 4B and 5, with regard to the second region 2, energy of most and/or all incident EUV light may be reflected from the second region 2 and may be sensed by the detector 50. Thus, in a corresponding region (1×2) of the matrix data 400a, corresponding image information reconstructed by the control unit 70 based on a second energy information generated by the detector 50 with regard to the second region 2 may have a value of '1'. More particularly, the control unit 70 may transmit the value '1' to the storage unit 80 and the value '1' may be stored in the corresponding region (1×2) of the matrix data 400a.

The movable unit 35 may then move the mask 40 in the −x-axis direction. EUV light may then be irradiated to a third region 3 of the mask 40. Referring to FIGS. 4B and 5, with regard to the third region 3, energy of most and/or all incident EUV light may be reflected from the third region 3 and may be sensed by the detector 50. Thus, in a corresponding region (1×3) of the matrix data 400a, corresponding image information reconstructed by the control unit 70 based on a third energy information generated by the detector 50 with regard to the third region 3 may have a value of '1'. More particularly, the control unit 70 may transmit the value '1' to the storage unit 80 and the value '1' may be stored in the corresponding region (1×3) of the matrix data 400a.

The movable unit 35 may move the mask 40 in the −x-axis direction. EUV light may then be irradiated to a fourth region 4 of the mask 40. Referring to FIGS. 4B and 5, with regard to the fourth region 4, energy of about 50% of all incident EUV light may be absorbed by the mask pattern 500 and about 50% may be reflected from the fourth region 4, and may be sensed by the detector 50. Thus, in a corresponding region (1×4) of the matrix data 400a, corresponding image information reconstructed by the control unit 70 based on a fourth energy information generated by the detector 50 with regard to the fourth region 4 may have a value of '0.5'. More particularly, the control unit 70 may transmit the value '0.5' to the storage unit 80 and the value '0.5' may be stored in the corresponding region (1×4) of the matrix data 400a.

The movable unit 35 may move the mask 40 in the −x-axis direction. EUV light may then be irradiated to a fifth region 5 of the mask 40. Referring to FIGS. 4B and 5, with regard to the fifth region 5, energy of about 100% of all incident EUV light may be absorbed by the mask pattern 500 and about 0% may be reflected from the fifth region 5, and may be sensed by the detector 50. Thus, in a corresponding region (1×5) of the matrix data 400a, corresponding image information reconstructed by the control unit 70 based on a fifth energy information generated by the detector 50 with regard to the fifth region 5 may have a value of '0'. More particularly, the control unit 70 may transmit the value '0' to the storage unit 80 and the value '0' may be stored in the corresponding region (1×5) of the matrix data 400a.

The operations described above may be repeated until EUV light is irradiated to each of a sixth through twelfth regions of the mask 40, and the corresponding energy information of the EUV light is reconstructed. In such embodiments, at this stage, the image information of the first through twelfth regions of the mask 40 may be stored in regions (1×1, 1×2, . . . , 1×12) of the matrix data 400a.

Then, in such embodiments, e.g., the movable unit 35 may move the mask 40 in the +y-axis direction. EUV light may then be irradiated to a $13^{th}$ region 13 of the mask 40. Referring to FIGS. 4B and 5, with regard to the $13^{th}$ region 13, energy of about 50% of all incident EUV light may be absorbed by the mask pattern 500 and about 50% may be reflected from the $13^{th}$ region 13, and may be sensed by the detector 50. Thus, in a corresponding region (2×12) of the matrix data 400a, corresponding image information reconstructed by the control unit 70 based on a thirteenth energy information generated by the detector 50 with regard to the thirteenth region 13 may have a value of '0.5'. More particularly, the control unit 70 may transmit the value '0.5' to the storage unit 80 and the value '0.5' may be stored in the corresponding region (2×12) of the matrix data 400a.

The movable unit 35 may then move the mask 40 in the +x-axis direction. Likewise, EUV light may be irradiated to $14^{th}$ through $24^{th}$ regions of the mask 40 and the control unit 70 may respectively reconstruct energy information of EUV light reflected from each of the respective regions. The reconstructed $14^{th}$ through $24^{th}$ image information may be stored in regions (2×11, 2×10 through 2×1) of the matrix data 400a.

Further, e.g., with regard to the $17^{th}$ region 17, a portion of EUV light may be absorbed by the defect 600 of the mask pattern 500. Referring to FIGS. 4B and 5, when EUV light is irradiated to the $17^{th}$ region 17 of the mask 40, Referring to FIGS. 4B and 5, energy of about 20% of all incident EUV light may be absorbed by the defect 600 and about 80% may be reflected from the $17^{th}$ region 17, and may be sensed by the detector 50. Thus, in a corresponding region (2×8) of the matrix data 400a, corresponding image information reconstructed by the control unit 70 based on a seventeenth energy information generated by the detector 50 with regard to the seventeenth region 17 may have a value of '0.8'. More particularly, the control unit 70 may transmit the value '0.8' to the storage unit 80 and the value '0.8' may be stored in the corresponding region (2×8) of the matrix data 400a.

When the respective image information about the $13^{th}$ through $24^{th}$ regions of the mask 40 is reconstructed and stored in the corresponding regions (2×9 through 2×1) the matrix data 400a of the storage unit, the movable unit 35 may move the mask 40 in the +y-axis direction. EUV light may then be irradiated to $25^{th}$ through $36^{th}$ regions of the mask 40 and the control unit 70 may reconstruct respective energy information of EUV light reflected from the respective regions. The reconstructed $25^{th}$ through $36^{th}$ image information may be stored in regions (3×1 through 3×12) of the matrix data 400a of the storage unit 80.

The matrix data 400a stored in the storage unit 80 may be transmitted to the output unit 90. The output unit 90 may output the corresponding aerial image in the form of, e.g., light and darkness and/or in the form of a cross-sectional view based on the values of the matrix data 400a.

Referring to FIG. 6, the output unit 90 may output the corresponding aerial image of the mask 40 in the form of light and dark regions, e.g., 36 regions, based on the respective values of the transmitted matrix data (see 400a of FIG. 5). For example, according to the values of the matrix data 400a, 0 may be output as black, 1 may be output as white, 0.5 may be output as gray, and 0.8 may be output as gray, with darkness of gray decreasing as the value approaches 1. When the aerial image of the mask 40 is output according to the corresponding matrix data (see 400a of FIG. 5), it may be determined whether a defect, e.g., defect 600, has occurred or not. In the exemplary embodiment of FIGS. 5-7, the defect 600 is present.

Referring to the exemplary aerial image of FIG. 6, with regard to the aerial image of the exemplary mask 40 illustrated therein, the first through $12^{th}$ regions repeat a pattern unit 510 (1-1-1-0.5-0-0.5), and thus it may be expected that scanning can be performed without any problem. The $19^{th}$ through $24^{th}$ (14→24) regions also have the pattern unit 510, and the $25^{th}$ through $36^{th}$ regions have two of the pattern unit 510, and thus it may be expected that scanning can be performed without any problem. However, the $13^{th}$ through $18^{th}$ regions have a defective pattern unit 520 (1-0.8-1-0.5-0-0.5) including a defect 550, corresponding to the defect 600 (see FIG. 5) of the $17^{th}$ region 17. Thus, it may be expected that a defect may be formed in a photoresist when developed after scanning.

Referring to FIG. 7, the output unit 90 (see FIG. 4B) may output aerial images of the mask 40 based on the values of the corresponding transmitted matrix data (see 400a of FIG. 5). In FIG. 7, the exemplary aerial images are cross-sectional views along lines a-a', b-b', and c-c' of FIG. 5. For example, the output unit 90 may output the aerial image of a portion of the mask taken along line a-a' based on values of regions along a first row of the matrix data (see 400a of FIG. 5). Likewise, the aerial images of portions of the mask taken along lines b-b' and c-c' may be output based on values of the second and third rows of the matrix data (see 400a of FIG. 5).

Referring to FIGS. 5, 6 and 7, the a-a' cross-section (first through $12^{th}$ regions), and the c-c' cross-section ($25^{th}$ through $36^{th}$ regions) may each include two of a pattern unit 610 (1-1-1-0.5-0-0.5), and thus, it may be expected that scanning ($13^{th}$ may be performed without any problem. With regard to the b-b' cross-section through $24^{th}$ regions), the $19^{th}$ through $24^{th}$ regions may include the pattern unit 610 (1-1-1-0.5-0-0.5), and thus, it may be expected that scanning may be performed without any problem. However, the $13^{th}$ through $18^{th}$ regions may include a defective pattern unit 620 (1-0.8-1-0.5-0-0.5) including a defect 650 of the $17^{th}$ region, and thus, it may be expected that a defect may be formed in a photoresist developed after scanning.

In some embodiments, the output unit 90 may output aerial images that are symmetric to the aerial images described above with respect to an x-axis, and thus, an expected image of a photoresist pattern on a wafer that is developed after scanning, not the aerial image of the mask, may be obtained.

Figure 8A:
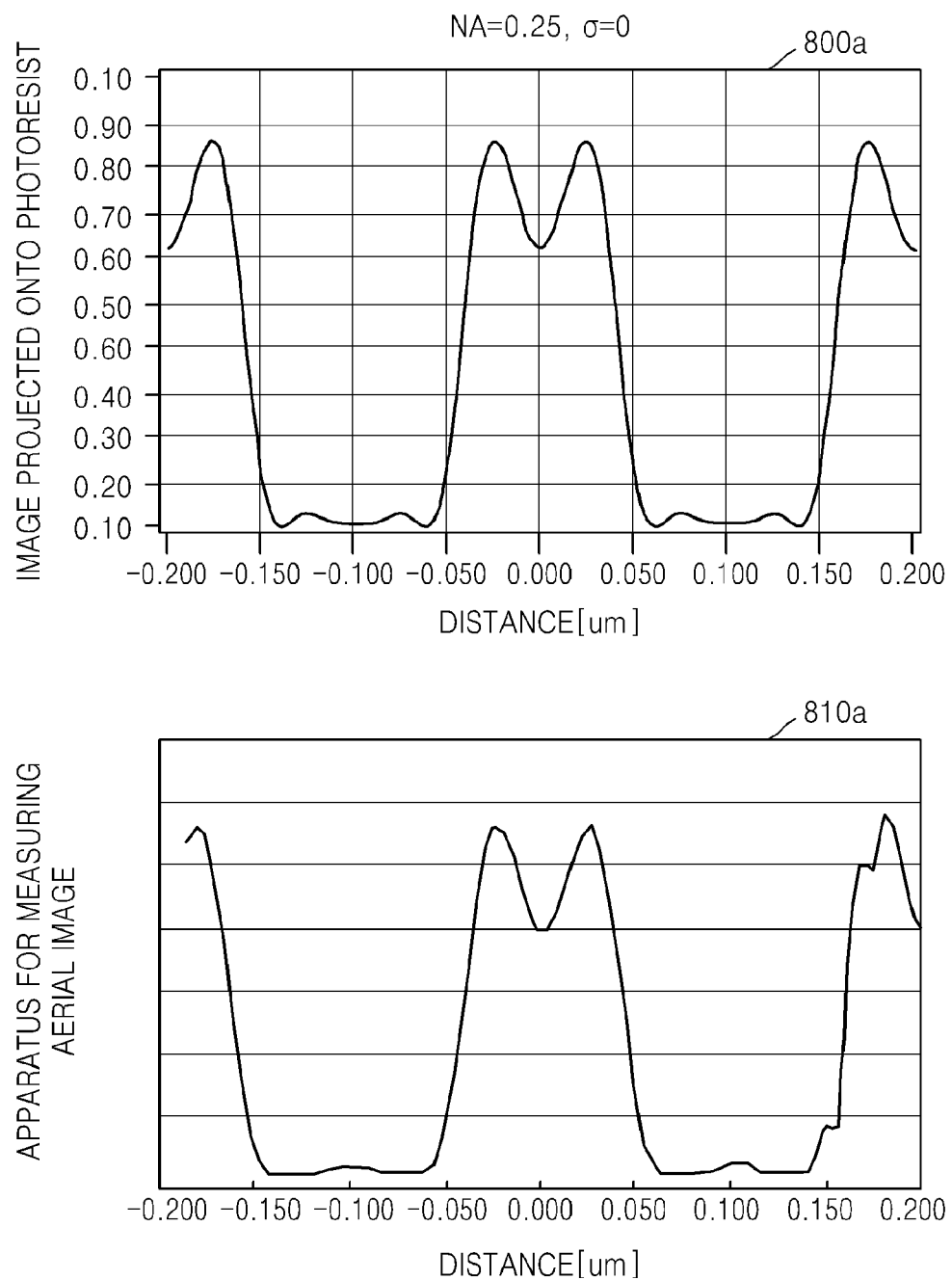
FIGS. 8A and 8B each illustrate a cross-sectional view of an image projected onto a photoresist and a corresponding aerial image reconstructed by the output unit of FIG. 4B.
Figure 8B:
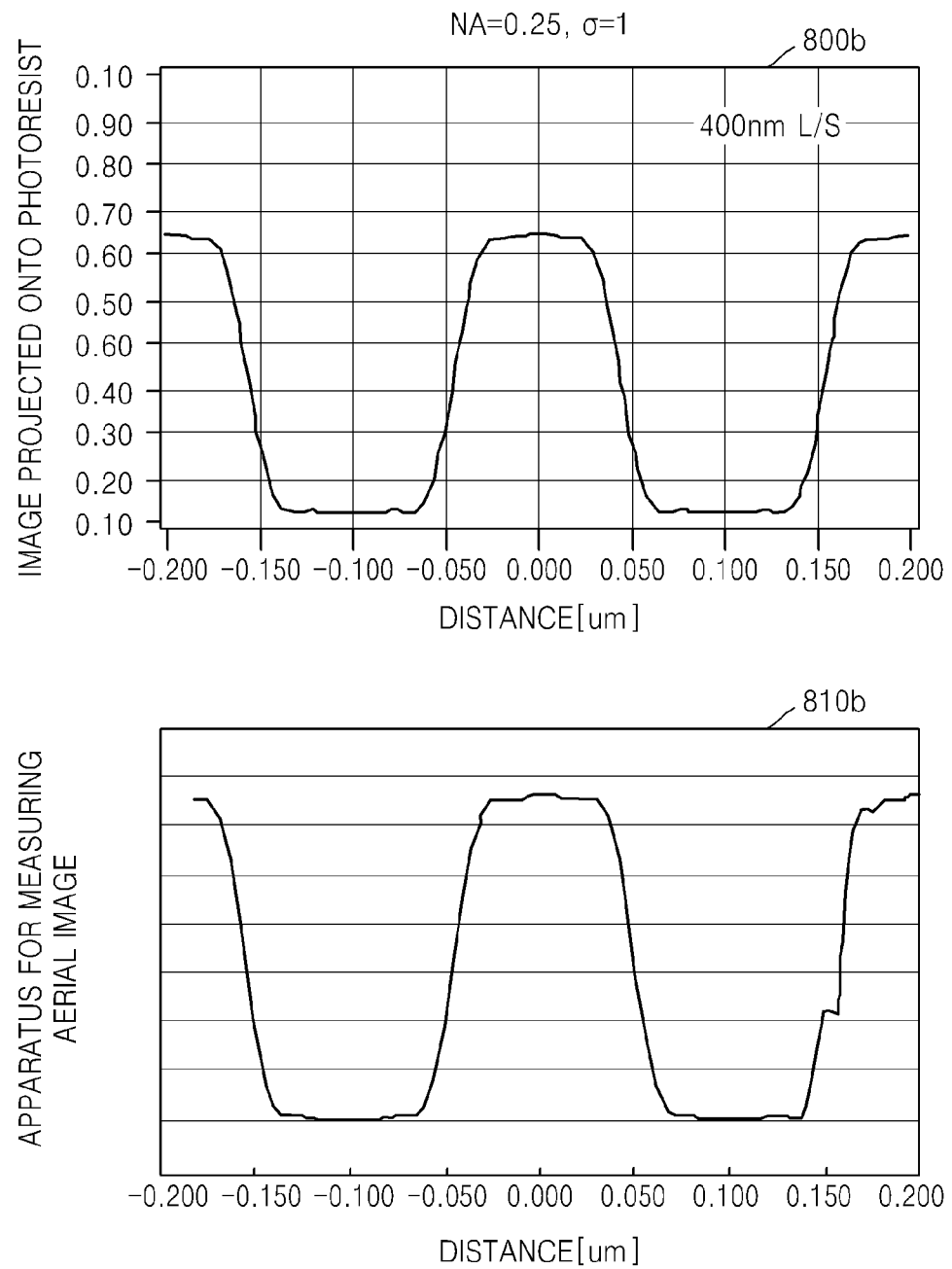

FIGS. 8A and 8B each illustrate a cross-sectional view of an image projected onto a photoresist and a corresponding aerial image of a mask reconstructed by an output unit of an apparatus for measuring an aerial image according to another embodiment of the inventive concept, wherein the aerial image shows a cross-sectional view of the mask.

Referring to FIG. 8A, in an exemplary embodiment, $NA_{scanner}$ is 0.25 and $\sigma$ is 0. Thus, the zoneplate lens 30 and the detector 50 (see, e.g., FIG. 1) of the apparatus for measuring an aerial image may be designed in consideration of numerical apertures obtained using Equation 1 ($NA_{zoneplate}=0.25/4=0.0625$, and $NA_{detector}=0$).

Referring to FIG. 8B, in an other exemplary embodiment, $NA_{scanner}$ is 0.25 and $\sigma$ is 1. Thus, the zoneplate lens 30 and the detector 50 of the apparatus for measuring an aerial image may be designed in consideration of numerical apertures obtained using Equation 1 ($NA_{zoneplate}=0.25/4=0.0625$, $NA_{detector}=0.0625$).

Referring to FIGS. 8A and 8B, it may be seen that images 800a and 800b projected onto a respective photoresist are identical to aerial images 810a and 810b that are output using the apparatus (see, e.g., FIG. 1) for measuring an aerial image designed according to Equation 1, wherein the aerial images 800a, 800b, 810a and 810b illustrate cross-sectional views. Thus, an apparatus for measuring an aerial image employing one or more features described herein may emulate an image projected on a photoresist based on the numeric aperture and off-axis degree of a scanner.

Figure 9A:
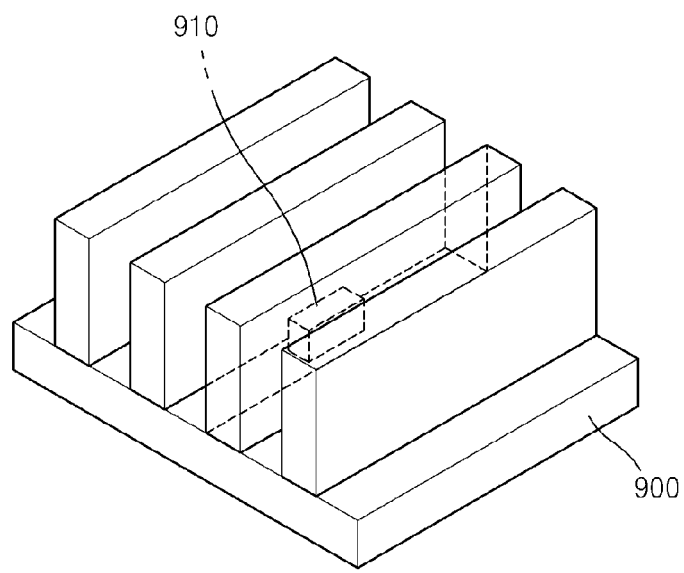
FIG. 9A illustrates an exemplary mask pattern that includes a defect and from which energy information may be obtained and supplied to the output unit of FIG. 4B.
Figure 9B:
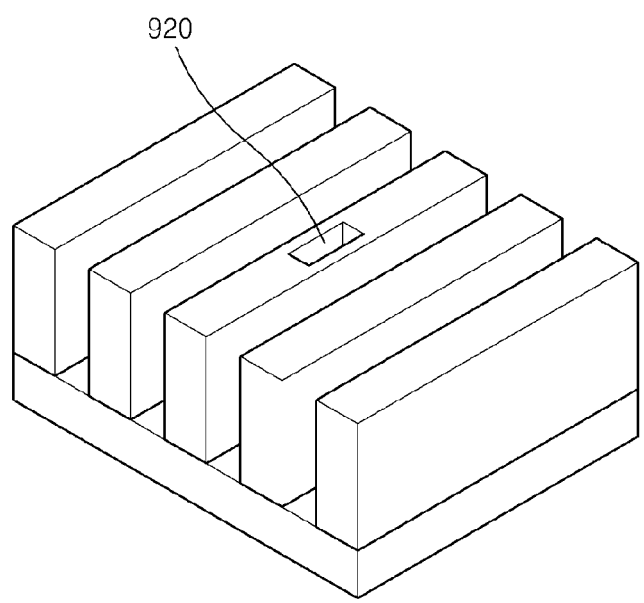
FIGS. 9B and 9C respectively illustrate exemplary light and dark aerial images, which may be output from the output unit of FIG. 4B based on the mask pattern of FIG. 9A.

FIG. 9A illustrates an exemplary mask pattern 900 that includes a defect 910 and from which energy information may be obtained and supplied to the output unit of FIG. 4B. FIG. 9B illustrates an exemplary light aerial image, which may be output from, e.g., the output unit 90 of FIG. 4B, and FIG. 9C illustrates an exemplary dark aerial image, which may be output from the output unit 90 of FIG. 4B.

Referring to FIG. 9A, in an exemplary embodiment, $NA_{scanner}$ is 0.25, and, according to Equation 1, $NA_{zoneplate}=NA_{scanner}/4=0.0625$. In the exemplary embodiment, because $\sigma$ is 0.5, $NA_{detector}=NA_{scanner}/4*\sigma=0.03125$. As described above with regard to Equation 1 and Equation 2, in embodiments, a zoneplate lens, e.g., 30 of FIG. 1, and a detector, e.g., 50 of FIG. 1, may be designed according to $NA_{zoneplate}$ and $NA_{detector}$. In the exemplary embodiment of FIG. 9A, the mask 900 including the defect 910 having a size of 40 nm may be measured using an embodiment of apparatus for measuring an aerial image including one or more features described herein.

Figure 9C:
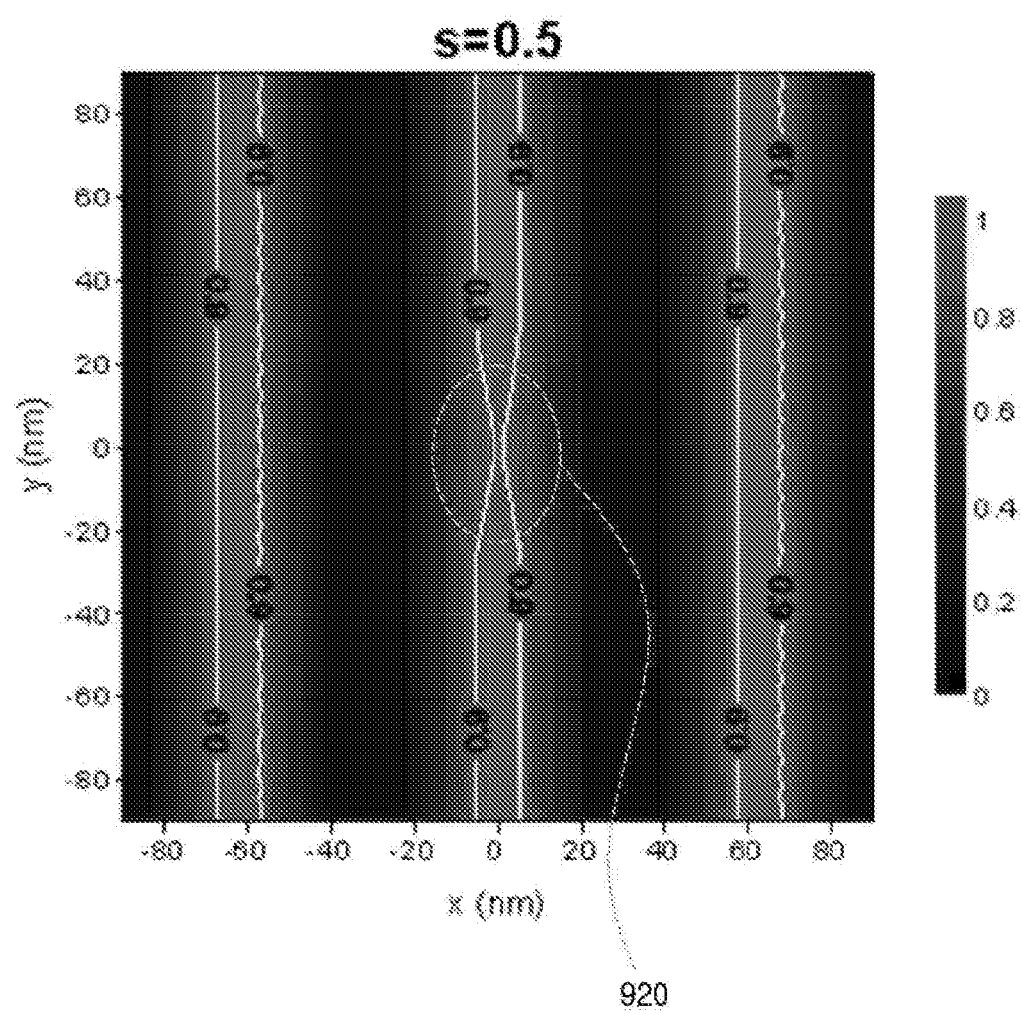

Referring to FIGS. 9B and 9C, in corresponding light and dark aerial images of the mask 900, the defect 910 may appear white and black, respectively, a corresponding region 920 of the output image. In the exemplary embodiment of FIGS. 9A, 9B and 9C, the defect 910 affects 10% or more of the aerial image intensity. In some embodiments, whether a defect may be detected may be based on an extent of the defect. That is, e.g., in some embodiments, only defects affecting more than a predetermined amount of an aerial image intensity may be detected. In the exemplary embodiment of FIGS. 9A, 9B, and 9C, a defect affecting 10% or more of the aerial image intensity may be flagged. Thus, the defect 910 may be flagged as a defect, and the mask pattern 900 may be corrected, e.g., removed/filled, before the mask may be scanned, e.g., during a semiconductor fabrication process. That is, by employing a method or apparatus for detecting a defect accordingly a defect of a mask may be sensed and removed before the scanning.

Figure 10:
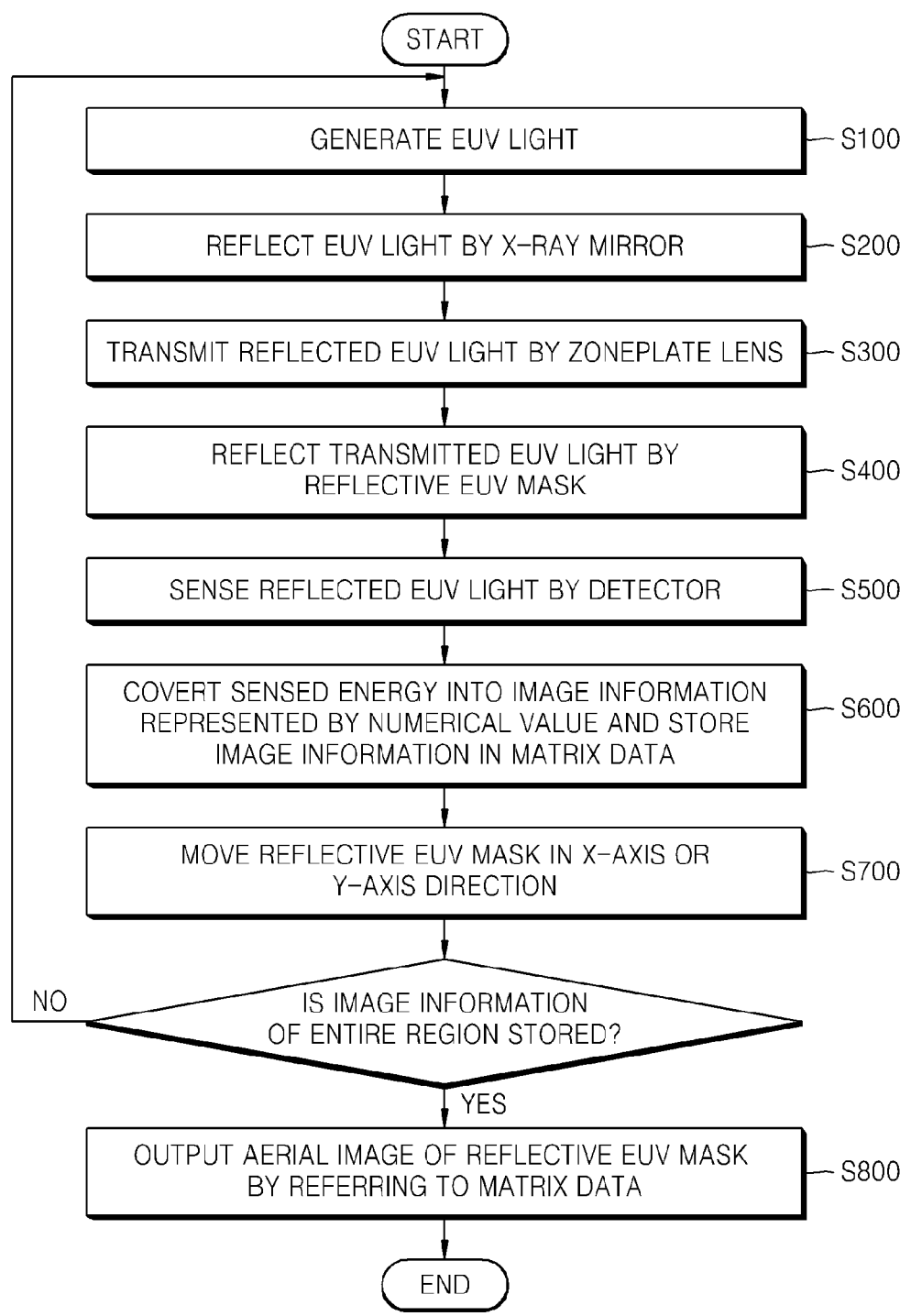
FIG. 10 illustrates a flowchart of an exemplary embodiment of a method of measuring an aerial image.

FIG. 10 illustrates a flowchart of an exemplary embodiment of a method of measuring an aerial image.

Referring to FIG. 10, EUV light may be generated (S100), and the generated EUV light may be reflected by an X-ray mirror (S200). The X-ray mirror may be arranged such that the EUV light is incident on a portion of a mask at an angle of about 4° to about 8° with respect to a normal line of the mask. The reflected EUV light may be transmitted by a zoneplate lens (S300). The zoneplate lens may be arranged such that the EUV light is incident on a portion of the mask at an angle of about 4° to about 8° with respect to the normal line of the mask. The EUV light focused on the portion of the mask may be reflected by the mask including a reflective material (S400). The detector may sense energy of the EUV light reflected by the mask (S500). In embodiments, the zoneplate lens and the detector may be formed such that Equation 1 is satisfied. The sensed energy may be reconstructed in the form of image information represented as a numeric value, the numerical value of the image information may be stored in a matrix data of a storage unit (S600). Then, a movable unit may move the mask in an x-axis or y-axis direction (S700), and the operations described above may be repeatedly performed. When image information of an entire region of the mask is stored in the matrix data, the aerial image of the mask may be output by using the matrix data (S800).

It will also be understood that when an element is referred to as being "between" two elements, it can be the only element between the two elements, or one or more intervening elements may also be present. Like reference numerals refer to like elements throughout the specification.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Embodiments are described herein with reference to cross-section illustrations that are schematic illustrations of idealized embodiments of the present inventive concept. As such, variations from the shapes of the illustrations as a result, for example, of manufacturing techniques and/or tolerances, are to be expected. Thus, the illustrations should not be construed as limited to the particular shapes of regions illustrated therein, but are to include deviations in shapes that result, for example, from manufacturing. For example, in the drawings used to describe the exemplary embodiments, the shapes of the respective components are for illustrative purposes only. The respective components may have various other shapes.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for measuring an aerial image, the apparatus comprising:
   a movable unit adapted to move a reflective extreme ultra-violet (EUV) mask disposed thereon in an x-axis and/or y-axis direction;
   an X-ray mirror arranged on the movable unit, the X-ray mirror being adapted to selectively reflect a coherent EUV light having a selected wavelength;
   a zoneplate lens that is located between the movable unit and the X-ray mirror, the zoneplate lens being adapted to focus the coherent EUV light on a portion of the reflective EUV mask; and
   a detector arranged on the movable unit, the detector being adapted to sense energy of the reflected coherent EUV light when the focused coherent EUV light is reflected by the portion of the reflective EUV mask,
   wherein numerical apertures of the zoneplate lens and detector are based on parameters of a scanner used to form a pattern through the EUV mask, the parameters of the scanner including a numerical aperture, an off-axis degree, and a reduction magnification.

2. The apparatus as claimed in claim 1, further comprising an aperture between the reflective EUV mask and the detector.

3. The apparatus as claimed in claim 1, wherein the X-ray mirror comprises a multi-layer structure including at least one molybdenum layer and at least one silicon layer, which are alternately arranged.

4. The apparatus as claimed in claim 1, further comprising a EUV light generator, the EUV light generator comprising:
   a high power femtosecond laser adapted to output a high power femtosecond laser beam;
   a gas cell adapted to generate the coherent EUV light having a selected wavelength from the high power femtosecond laser; and
   a lens adapted to focus the high power femtosecond laser beam on the gas cell.

5. The apparatus as claimed in claim 4, wherein the gas cell is filled with a neon gas so as to optimize a production efficiency of a coherent EUV light having a wavelength of 13.5 nm.

6. The apparatus as claimed in claim 4, wherein the X-ray mirror is adapted to reflect the coherent EUV light emitted from the EUV light generator toward the portion of the reflective EUV mask at an angle of about 4° to about 8° with respect to a normal line of the reflective EUV mask.

7. The apparatus as claimed in claim 1, wherein the zoneplate lens is adapted to focus the reflected coherent EUV light on the portion of the reflective EUV mask at an angle of about 4° to about 8° with respect to a normal line of the reflective EUV mask.

8. The apparatus as claimed in claim 1, further comprising a computing unit adapted to reconstruct an image of the reflective EUV mask based on energy sensed by the detector.

9. The apparatus as claimed in claim 1, wherein numerical apertures of the zoneplate lens and detector are based on incidence and reflection angles of the coherent EUV light on and from the reflective EUV mask.

10. An apparatus for measuring an aerial image of a pattern corresponding to a semiconductor pattern to be formed by scanning the pattern using a scanner, the apparatus comprising:
    a zoneplate lens arranged on a first side of an extreme ultra-violet (EUV) mask including the pattern, the zoneplate lens adapted to focus EUV light on a portion of the EUV mask at a same angle as an angle at which the scanner will be disposed with respect to a normal line of the EUV mask; and
    a detector arranged on a second side of the EUV mask and adapted to sense energy of the EUV light from the EUV mask,
    wherein numerical apertures of the zoneplate lens and detector are based on parameters of a scanner used to form a pattern through the EUV mask, the parameters of the scanner including a numerical aperture, an off-axis degree, and a reduction magnification.

11. The apparatus as claimed in claim 10, further comprising a movable unit on which the EUV mask is arranged, the movable unit being adapted to move the EUV mask in an x-axis direction and/or an y-axis direction.

12. The apparatus as claimed in claim 10, wherein the EUV mask is a reflective EUV mask including a reflective material.

13. The apparatus as claimed in claim 12, wherein the detector is adapted to sense energy of reflected EUV light that is reflected from the reflective EUV mask.

14. The apparatus as claimed in claim 10, further comprising an EUV light generator and an X-ray mirror adapted to selectively reflect the EUV light from the EUV light generator.

15. The apparatus as claimed in claim 14, wherein the EUV light generator includes a high power femtosecond laser.

16. The apparatus as claimed in claim 10, wherein the EUV mask is a transmissive EUV mask.

17. The apparatus as claimed in claim 16, wherein the detector is adapted to sense energy of transmitted coherent EUV light that is transmitted through the transmissive EUV mask.

18. An apparatus for measuring an aerial image, the apparatus comprising:
    a light source configured to emit extreme ultra-violet (EUV) light;
    a movable unit adapted to move a reflective EUV mask disposed thereon in an x-axis and/or y-axis direction;
    a zoneplate lens configured to focus the EUV light on the EUV mask at a same angle as an angle at which a scanner will be disposed with respect to a normal to the EUV mask;
    a detector arranged on the movable unit, the detector being adapted to sense energy of RUV light reflected by the portion of the reflective EUV mask, wherein a ratio of a numerical aperture of the detector to a numerical aperture of the zoneplate lens equals an off-axis degree of the scanner used to form a pattern through the EUV mask.

19. An apparatus for measuring an aerial image, the apparatus comprising:
    a movable unit adapted to move an extreme ultra-violet (EUV) mask disposed thereon;
    a mirror arranged on the movable unit, the mirror being adapted to reflect an EUV light;
    a zoneplate lens located between the movable unit and the mirror, the zoneplate lens being adapted to focus the EUV light on a first region and on a second region of a first side of the EUV mask; and a detector arranged on the movable unit, the detector being adapted to sense energy of the EUV light reflected from the first region and second region of a second side of the EUV mask.

20. The apparatus as claimed in claim 19, wherein a numerical aperture of the zoneplate lens is based on parameters of a scanner used to form a pattern through the EUV mask, the parameters of the scanner including a numerical aperture and a reduction magnification.

21. The apparatus as claimed in claim 20, wherein $NA_{detector}=NA_{scanner}/n$, where $NA_{detector}$ denotes a NA of the detector, $NA_{scanner}$ denotes a NA of the scanner, and n denotes a reduction magnification of the scanner.

22. The apparatus as claimed in claim 19, wherein a ratio of a numerical aperture of the detector to a numerical aperture of the zoneplate lens equals an off-axis degree of the scanner used to form a pattern through the EUV mask.

23. An apparatus for measuring an aerial image of a pattern corresponding to a semiconductor pattern to be formed by scanning the pattern using a scanner, the apparatus comprising:

a zoneplate lens arranged on a first side of an extreme ultra-violet (EUV) mask including the pattern, the zoneplate lens adapted to focus an EUV light on different regions of the EUV mask; and a detector arranged on the first side of the EUV mask and adapted to sense energy of the EUV light reflected separately from the different regions of the EUV mask, the EUV light reflected from the different regions of the EUV mask passing outside the zoneplate lens.

24. The apparatus as claimed in claim 23, wherein numerical aperture of the zoneplate lens is based on parameters of a scanner used to form a pattern through the EUV mask, the parameters of the scanner including a numerical aperture and a reduction magnification.

25. The apparatus as claimed in claim 24, wherein $NA_{detector}=NA_{scanner}/n$, where $NA_{detector}$ denotes a NA of the detector, $NA_{scanner}$ denotes a NA of the scanner, and n denotes a reduction magnification of the scanner.

26. The apparatus as claimed in claim 23, wherein the zoneplate lens is adapted to focus the EUV light on a portion of the EUV mask at a same oblique angle as an oblique angle at which the scanner will be disposed with respect to a normal line of the EUV mask.

* * * * *